United States Patent [19]

Hartig et al.

[11] Patent Number: 5,213,672

[45] Date of Patent: May 25, 1993

[54] SPUTTERING APPARATUS WITH A ROTATING TARGET

[75] Inventors: Klaus Hartig, Ronneburg; Joachim Szczyrbowski, Goldbach, both of Fed. Rep. of Germany

[73] Assignee: Leybold Aktiengesellschaft, Hanau, Fed. Rep. of Germany

[21] Appl. No.: 744,511

[22] Filed: Aug. 13, 1991

[30] Foreign Application Priority Data

May 29, 1991 [DE] Fed. Rep. of Germany ....... 4117518

[51] Int. Cl.⁵ ............................................. C23C 14/35
[52] U.S. Cl. ........................... 204/298.22; 204/298.06; 204/298.11
[58] Field of Search ....................... 204/298.06, 298.11, 204/298.21, 298.22

[56] References Cited

U.S. PATENT DOCUMENTS

| | | | |
|---|---|---|---|
| 4,362,611 | 12/1982 | Logan et al. ................... | 204/298.06 |
| 5,100,527 | 3/1992 | Stevenson et al. ............. | 204/298.22 |
| 5,108,574 | 4/1992 | Kirs et al. ....................... | 204/298.22 |

*Primary Examiner*—Aaron Weisstuch
*Attorney, Agent, or Firm*—Felfe & Lynch

[57] ABSTRACT

An apparatus is presented, with a rotating target (18, 15), which is tubularly configured, with a stationary magnet unit (2) disposed within the tube, of a magnetron cathode, which produces a stationary plasma hose provided essentially with two long straight lines in front of the surface of the rotating target, which exercises an erosive action on the surface of the rotating target (18, 15), whereby the formation occurs of a narrowing of the diameter of the tubular rotating target (18, 15) in the middle portion of the tubular rotating target and the formation of margins at the two ends (14, 15) of the tubular rotating target be provided each with a darkspace shield (16, 17) which cover the margins of the tubular rotating target.

7 Claims, 3 Drawing Sheets

SPUTTERING APPARATUS WITH A ROTATING TARGET

BACKGROUND OF THE INVENTION

The invention relates to an apparatus for sputtering, especially reactive sputtering, with preferably a magnetron cathode, with a moving target, especially a rotating target.

In sputtering processes, high-power sputtering apparatus are used in practice in which a magnetic field in front of the cathode increases the probability of the collision of the particles and hence of their ionization. The heart of these high-power sputtering apparatus is the so-called magnetron cathode.

Such a magnetron cathode is described, for example, in German patent 2417288, which corresponds to U.S. Pat. No. 4,166,018.

In it is shown a cathode sputtering apparatus with a high sputtering rate, with a cathode having on one of its surfaces the material to be sputtered and to be deposited on a substrate, with a magnet system arranged such that magnetic lines of force issuing from the sputtering surface and returning thereto form a discharge area which has the shape of a closed loop, and with an anode disposed outside of the paths of the sputtered material moving from the sputtering surface to the substrate.

In the above-cited patent it is proposed that the cathode surface to be sputtered and facing the substrate to be sprayed be flat, that the substrate be moved over the planar sputtering surface parallel to the latter and close to the discharge area, and that the magnet system producing the magnetic field be disposed on the side of the cathode facing away from the planar sputtering surface.

In the prior art are also sputtering apparatus with a rotating magnetron cathode. The prospectus of Airco Coating Technology, a division of the BOC Group, Inc., with the identification ACT10110K988, hereinafter called "Airco Prospectus," describes the construction and the operation of such a sputtering apparatus, having a rotating magnetron cathode. As it appears from the illustration and the text of the Airco Prospectus, it is, strictly speaking, only the cylindrical or tubular-shaped target that rotates. The stationary magnet unit of the magnetron cathode is located in the interior of the target. Important components of such a known magnetron cathode include (see the Airco Prospectus-)—in addition to the rotating cylindrical target and the stationary magnet unit—the target drive system, a water cooling system, a vacuum chamber in which the rotating target and the substrate, among other things, are located, plus a power supply unit for the cathode. In practice, the target material is applied as a coating on a tube consisting of copper, for example. The system, consisting of a target coating and copper tube, rotates in front of the ionized plasma.

The prior art also includes U.S. Pat. No. 4,356,073, which corresponds to European Patent 0070899. In this patent is described an apparatus for sputtering thin films of a selected coating material onto substantially planar substrates, consisting of an evacuable coating chamber, a cathode mounted horizontally in this coating chamber, with an elongated, cylindrical tube element on whose outer surface a layer of the coating material to be sputtered is applied, and magnet means which are disposed in this tube element in order to provide a sputtering zone extending longitudinally therefrom.

U.S. Pat. No. 4,356,073 discloses rotating this tubular element about its longitudinal axis in order to bring various parts of the coating material into a sputtering position opposite the above-mentioned magnet means and within the above-mentioned sputtering zone, and through means situated in the coating chamber for the horizontal support of the substrates and for transporting the latter past the magnet means so that these substrates will receive the sputtered material.

There is also known Patent 161040 of the German Democratic Republic, though it does not relate to a rotating target. This last-named patent discloses an apparatus for the prevention of undesired discharges in reactive DC cathode sputtering, especially reactive DC high-rate sputtering, for the purpose of making electrically highly insulating coatings by using conventional plasmatron sputtering apparatus and a target edging applied to the target and reaching to a point close to the discharge.

In the last-named patent it is proposed that the target edging consist of an electrically insulating material of the smallest possible thickness, and that between the target edging and the target a gap-like cavity be provided whose width is no more than a few tenths of the average free travel length of the sputtered particles. The points of contact of the target edging with electrically conductive parts of the structure are at least twenty times the width of the gap-like cavity away from the edge of the target, and the target edging is covered at least in part by a shield whose distance from the target edging is of the order of magnitude of the width of the gap-like cavity.

In rotating tubular targets the central area is eroded by the plasma while no erosion occurs at the extremities. In the sputtering of certain materials, such as $SiO_2$ sputtered layers additionally form on the tube ends during the sputtering process.

During the sputtering process, the rotating target is eroded by the above-described processes so that the middle portion has a smaller diameter, while the tube ends have a larger diameter. In a number of applications, the tube ends even become additionally thickened by the described growth of a coating of sputtered material on the tube ends.

The processes described above lead to a heightened danger of undesired arcing between the target and the inside wall of the chamber, between target and substrate, and between the target and the coating consisting of sputtered material that has already grown on the substrate. This danger of arcing exists especially in the case of the following sputtering materials: $SiO_2$, $Al_2O_3$, $ZrO_2$, $ZnO$, $Ta_2O_5$.

SUMMARY OF THE INVENTION

The sputtering of the rotating target with magnetron cathode is basically improved. Better conditions are created so that such sputtering of $SiO_2$ can be used not only on a laboratory scale but also in large-scale production.

Quite especially, arcing is prevented at the tube ends, particularly when $SiO_2$ is used.

The stated goals are achieved by providing the unsputtered areas of the target with a dark-space shielding.

In a sputtering apparatus with a rotating target of tubular configuration, with a stationary magnet unit of a magnetron cathode disposed within the tube and producing a stationary plasma loop essentially provided with two long straight lines in front of the surface of the rotating target, which exercises an erosive action resulting in a narrowing of the diameter of the middle portion and in the formation of margins at the two ends of the tubular rotating target, the ends are each provided with a dark space shielding covering the margins. It is furthermore proposed that, in a first embodiment, the dark-space shielding be grounded. An especially advantageous configuration of the subject matter of the invention consists, in a second embodiment, in connecting the dark-space shielding through an electrical conductor insulated from the vacuum chamber to a current-voltage supply unit connected by an additional conductor to the ground.

To improve the uniformity of the coating at the margins of a substrate that is to be coated by sputtering by means of an apparatus as described above, the dark-space shielding insulated from the sputtering apparatus is grounded through a variable voltage source.

Especially advantageous results are achieved if, in the case of a process pressure of $3 \times 10^{-3}$ mbar, the radial distance between the rotating target and the dark-space shielding is equal to or less than 2 mm.

To achieve still better results in preventing arcing it is furthermore proposed that an insulator, made for example from ceramic or quartz, be disposed between the rotating target and the dark-space shielding.

Between the rotating target and the dark-space shielding, an insulator can be disposed which is connected to the dark-space shielding, or which is connected to the rotating target and rotates together with it.

DETAILED DESCRIPTION OF THE PREFERRED EMBODIMENT

Figure 1:
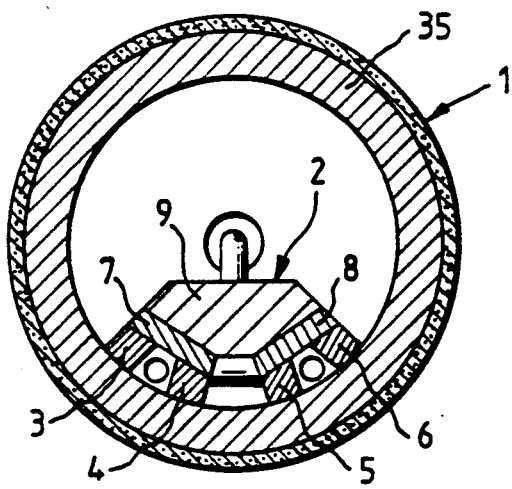
FIG. 1 is a diagrammatic representation of a section through a rotating target and stationary magnet unit, as in the state of the art.

In FIG. 1, the rotating target 1 is as disclosed in U.S. Pat. No. 4,356,073, see FIG. 3 therein, and as in the subject of the Airco Prospectus. In the prior art, the target material can be applied to a tube 35 consisting, for example, of copper. The target material can be silicon, for example.

The nonrotating magnet unit 2 disposed within the rotating target includes individual magnets 3, 4, 5, and 6. The associated magnet yokes 7 and 8 are fixed to a holder 9.

Figure 2:
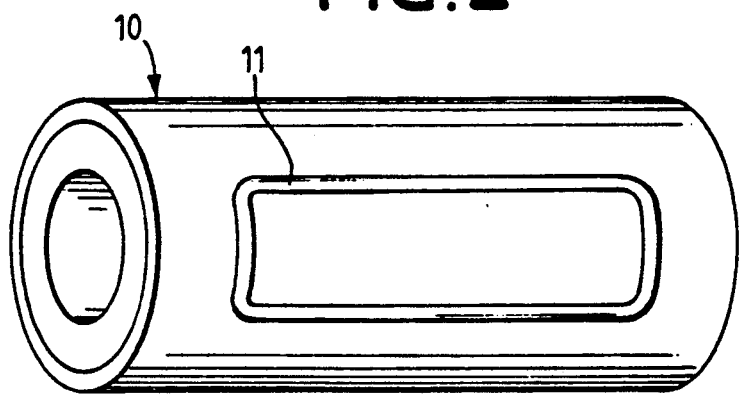
FIG. 2 shows the configuration of a sputter pit on the rotating target as sputtering begins.

As seen in FIG. 2, the magnet unit produces a standing plasma 11 over the rotating target 10. This standing plasma has the shape of a racetrack-like loop of substantially rectangular shape.

Figure 3:
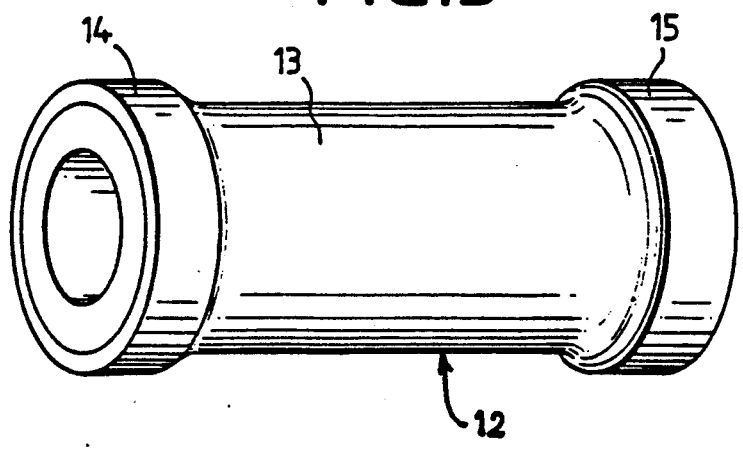
FIG. 3 shows an eroded rotating target.

As shown in FIG. 3, the erosive action of the plasma loop on the rotating target greatly erodes the middle part 13 of the rotating target 12 and narrows its diameter.

The diameters at the tube ends can increase in size due to the formation of a coating on the tube ends, especially in the formation of $SiO_2$ coatings. The tube ends with the larger diameter favor the formation of the above-described undesirable arcing effects.

Figure 4:
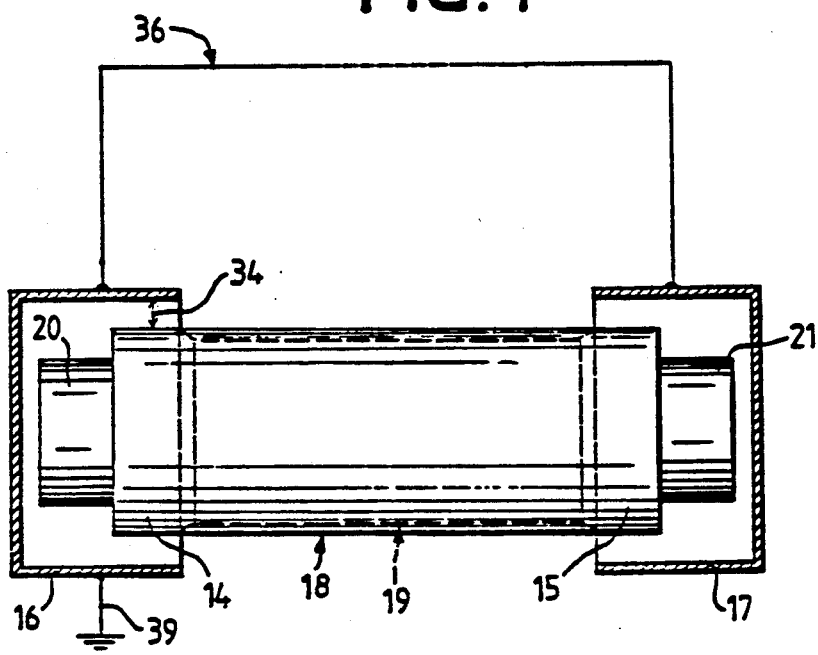
FIGS. 4 to 7 show diagrammatically some embodiments of the invention.

Referring to FIG. 4, the dark-space shields 16 and 17 disposed in the area of these tube ends prevent arcing between the rotating target and the substrate, the coating consisting of sputtering material that grows on the substrate and the inside wall of the vacuum process chamber. The dark-space shielding is connected by line 36 and is grounded through line 39 to the chamber wall, which is also grounded. Accordingly no arcing can take place between the dark-space shielding and the chamber wall.

The middle part of the target is shown in its initial, uneroded configuration 18 and in its later, eroded configuration 19, 20 and 21 are insulators.

Figure 5:
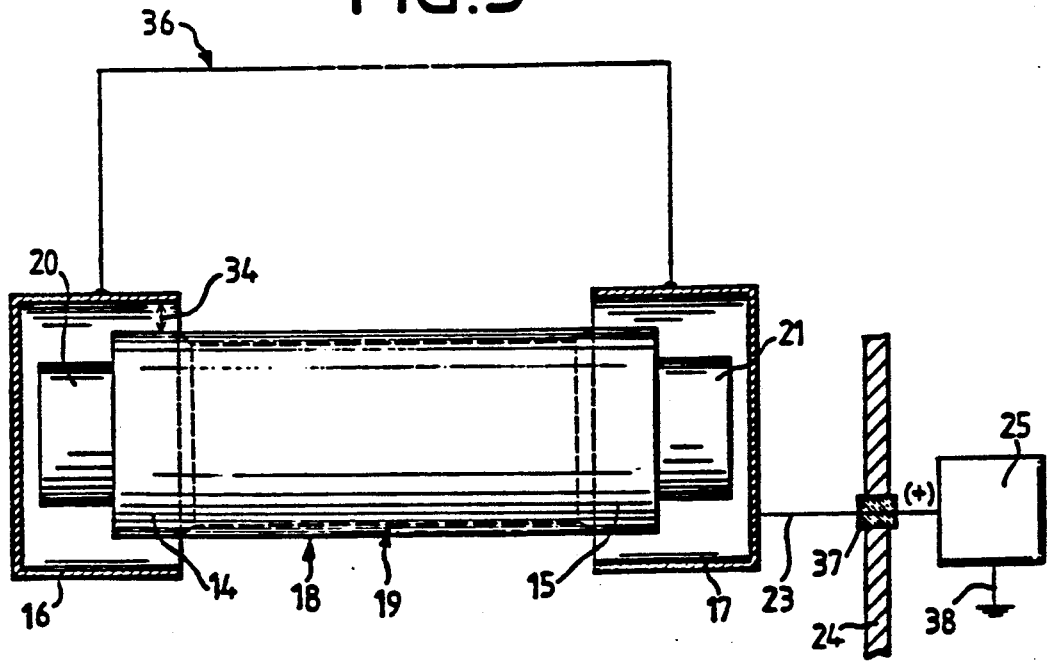

In a second embodiment, shown in FIG. 5, a line 23 is provided which is insulated from the wall 24 of the vacuum chamber by insulation 37. Line 23 connects the current-voltage supply unit 25, which can serve as a variable voltage source, to the dark-space shield 17. The dark-space shield 17 is connected by an outside line 36 to the dark-space shield 16. The current-voltage supply unit 25 is grounded via line 38. In the embodiment according to FIG. 6 an insulator 27 is disposed between the dark-space shielding 26 and the rotating target 28, and fixed to the dark-space shield 26.

Figure 7:
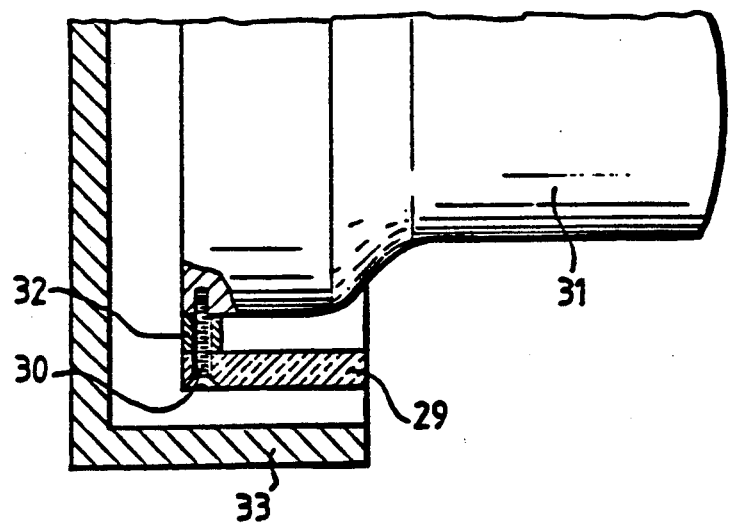

In the embodiment according to FIG. 7, an insulator 29 is connected to the rotating target 31 by a screw 30 passing through a spacer 32, which can be an insulator or conductor, so that the insulator 29 rotates together with the rotating target 31.

Figure 6:
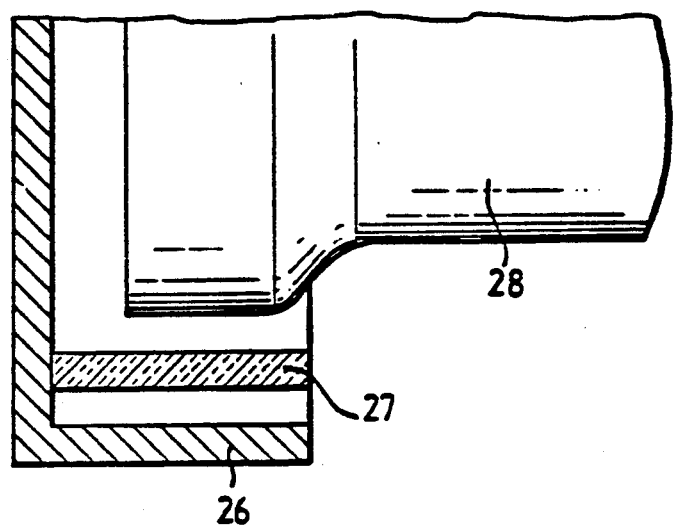

The insulators of FIGS. 6 and 7 can be ceramic or quartz. With the apparatus according to the invention a great number of sputtered materials can be produced. In addition to $SiO_2$, the following materials can also be used: $Al_2O_3$, $ZrO_2$, $TiO_2$, $ZnO$, $Ta_2O_5$.

In FIG. 5 it can be seen that line 23 from the dark-space shielding is brought out through insulation and is connected to ground by a variable voltage source (+), namely the current-voltage supply unit 25. The voltage can be from about 0 to +50 volts or from +50 volts to −50 volts. By varying the voltage the uniformity of the coating at the margins of the material to be coated can be controlled.

As seen in FIGS. 4 and 5, it has proven advantageous to select a radial spacing 34 between the rotating target and the dark-space shield of 2 mm or less at a process pressure of $3 \times 10^{-3}$ mbar.

We claim:

1. Apparatus for cathode sputtering comprising
   a rotatable tubular target having a middle portion and axially opposed ends,
   stationary magnet means disposed inside said tubular target for producing a stationary plasma loop above the rotating target to erode the middle portion of the target, thereby forming margins at said opposed ends,
   dark space shielding over each said end comprising a tubular portion spaced from each said margin, and
   a tubular insulator disposed between the tubular portion of the dark space shielding and the margin at each end of the target.

2. Apparatus according to claim 1 wherein the dark-space shielding is grounded.

3. Apparatus according to claim 2 wherein the radial distance (34) between the rotating target (18, 19) and the dark-space shielding (16, 17) is equal to or less than 2 mm.

4. Apparatus according to claim 1 wherein the insulator is fixed to the dark-space shielding.

5. Apparatus according to claim 1 wherein the insulator is fixed to the rotating target and rotates together with it.

6. Apparatus according to claim 1 wherein the dark-space shielding (16, 17) is connected by an electrical line (13) that is insulated from the vacuum chamber (24) to a current-voltage supply unit (25), the current-voltage supply unit being connected to ground through an additional line.

7. Apparatus according to claim 6 wherein said current-voltage supply unit is a variable voltage source.

* * * * *